US007744380B2

(12) United States Patent
Shuey et al.

(10) Patent No.: US 7,744,380 B2
(45) Date of Patent: Jun. 29, 2010

(54) OVERMOLDED ELECTRICAL CONTACT ARRAY

(75) Inventors: Joseph B. Shuey, Camp Hill, PA (US); Lewis Johnson, Dover, PA (US); Derek L. Brickner, Etters, PA (US); Ryan S. Gelotte, Enola, PA (US)

(73) Assignee: FCI Americas Technology, Inc, Carson City, NV (US)

( * ) Notice: Subject to any disclaimer, the term of this patent is extended or adjusted under 35 U.S.C. 154(b) by 0 days.

(21) Appl. No.: 11/677,449

(22) Filed: Feb. 21, 2007

(65) Prior Publication Data

US 2008/0200049 A1 Aug. 21, 2008

(51) Int. Cl.
*H01R 12/00* (2006.01)
*H05K 1/00* (2006.01)

(52) U.S. Cl. .................................... 439/79; 439/607.5

(58) Field of Classification Search .................. 439/79, 439/80, 736, 78, 885, 74, 608, 607.5
See application file for complete search history.

(56) References Cited

U.S. PATENT DOCUMENTS 2,932,811 A 4/1960 Abraham et al.
4,125,313 A * 11/1978 Sipp et al. .................. 439/651
4,235,832 A 11/1980 Leighton
4,396,245 A 8/1983 Lane
4,641,908 A * 2/1987 Steffinger .................. 439/599
5,026,295 A 6/1991 Fong et al.
5,213,514 A * 5/1993 Arai .......................... 439/79
5,219,295 A * 6/1993 Niwa et al. .................. 439/79
5,387,123 A 2/1995 Puerner
5,601,444 A 2/1997 Cox
5,681,174 A 10/1997 Correll, Jr. et al.
5,722,861 A 3/1998 Wetter
5,924,876 A 7/1999 Beamenderfer et al.
5,931,687 A 8/1999 McFarlane et al. ............ 439/79
6,139,336 A 10/2000 Olson
6,144,563 A 11/2000 Feldman et al. ............. 361/829
6,200,171 B1 3/2001 Fusselman et al.
6,210,218 B1 4/2001 Chang ........................ 439/567
6,219,913 B1 4/2001 Uchiyama .................... 29/883
6,269,005 B1 7/2001 Tung et al.
6,350,134 B1 2/2002 Fogg et al. .................... 439/79
6,402,552 B1 6/2002 Wagner ...................... 439/606
6,505,402 B2 1/2003 Moriwake et al. ............ 29/883
6,506,064 B1 1/2003 Wu (Continued)

FOREIGN PATENT DOCUMENTS

WO WO 2007076901 A1 7/2007

*Primary Examiner*—Javaid Nasri
(74) *Attorney, Agent, or Firm*—Woodcock Washburn LLP

(57) ABSTRACT

The invention provides a connector incorporating an overmolded housing that may control the position of the mounting ends of the connector and may provide a structure to help transfer the forces for press fit of the connector to the printed circuit board (PCB). Such a connector may include a first leadframe assembly having a plurality of contacts, a second leadframe assembly having a plurality of contacts, an edge card, and a tail alignment housing. Each contact may include a lead portion and a mounting end. The lead portions of the contacts may engage the edge card. The tail alignment housing may include a housing body and a plurality of tail supports extending from the housing body. The tail alignment housing may be overmolded onto at least a portion of the mounting ends.

35 Claims, 16 Drawing Sheets

U.S. PATENT DOCUMENTS 6,685,486 B1 2/2004 Zhang et al. .................. 439/79
6,736,676 B2 5/2004 Zhang et al. ................ 439/607
7,083,441 B1 8/2006 Lee
7,175,446 B2 * 2/2007 Bright et al. .................. 439/79
7,204,699 B2 4/2007 Stoner et al.
7,214,104 B2 5/2007 Minich et al.
7,258,551 B2 8/2007 Minich
7,384,289 B2 6/2008 Minich et al.
2005/0208797 A1 9/2005 Duncan et al.
2006/0068620 A1 3/2006 Okamura et al. .............. 439/79
2006/0134952 A1 6/2006 Meister et al. .............. 439/148
2006/0216969 A1 9/2006 Bright et al. .................. 439/79
2006/0223343 A1 10/2006 Campini et al. ............... 439/64

* cited by examiner

OVERMOLDED ELECTRICAL CONTACT ARRAY

CROSS REFERENCE TO RELATED APPLICATION

This application is related to application Ser. No. 11/677,413, filed concurrently herewith.

FIELD OF THE INVENTION

The invention relates generally to electrical connectors. More particularly, the invention relates to connectors having tails.

BACKGROUND OF THE INVENTION

Advanced Mezzanine Cards are printed circuit boards (PCBs) that follow a specification of the PCI Industrial Computers Manufacturers Group (PICMG). PICMG AMC connectors may be used in accordance with such a specification. Typically, manufacturers of such connectors mold the contacts in a vertical (or "column") direction. Accordingly, each column of contacts is molded into a separate leadframe assembly. In some such connectors, as many as 80 or more contact columns are required. Consequently, a relatively large number of individual insert molded leadframe assemblies (IMLAs) may be required to make such a connector.

Due to the number of separate IMLAs required to make such a connector, manufacturers have proposed insert molding the contacts into a plurality of horizontal arrays, or "rows." With such connectors, however, there are problems with controlling the positioning and straightness of the mounting ends of the electrical contacts (i.e., the contact "tails") in a cost-effective manner.

SUMMARY OF THE INVENTION

The invention provides a connector that incorporates a tail-alignment housing that may control the position of the mounting, or "tail," ends. The tail-alignment housing may also provide a structure that helps absorb the forces required for press fitting the connector to a printed circuit board (PCB). The tail-alignment housing may have a housing body and a plurality of tail supports extending from the housing body up and around the contact tails.

In one embodiment, such a connector may include a first leadframe assembly having a first plurality of contacts, a second leadframe assembly having a second plurality of contacts, an edge card, and a tail-alignment housing. Each contact may include a lead portion and a mounting end. The lead portions of the contacts may engage the edge card. The tail-alignment housing may include a housing body and a plurality of tail supports extending from the housing body. The tail alignment housing may be overmolded onto the contact mounting ends.

DETAILED DESCRIPTION OF ILLUSTRATIVE EMBODIMENTS

Figure 1:
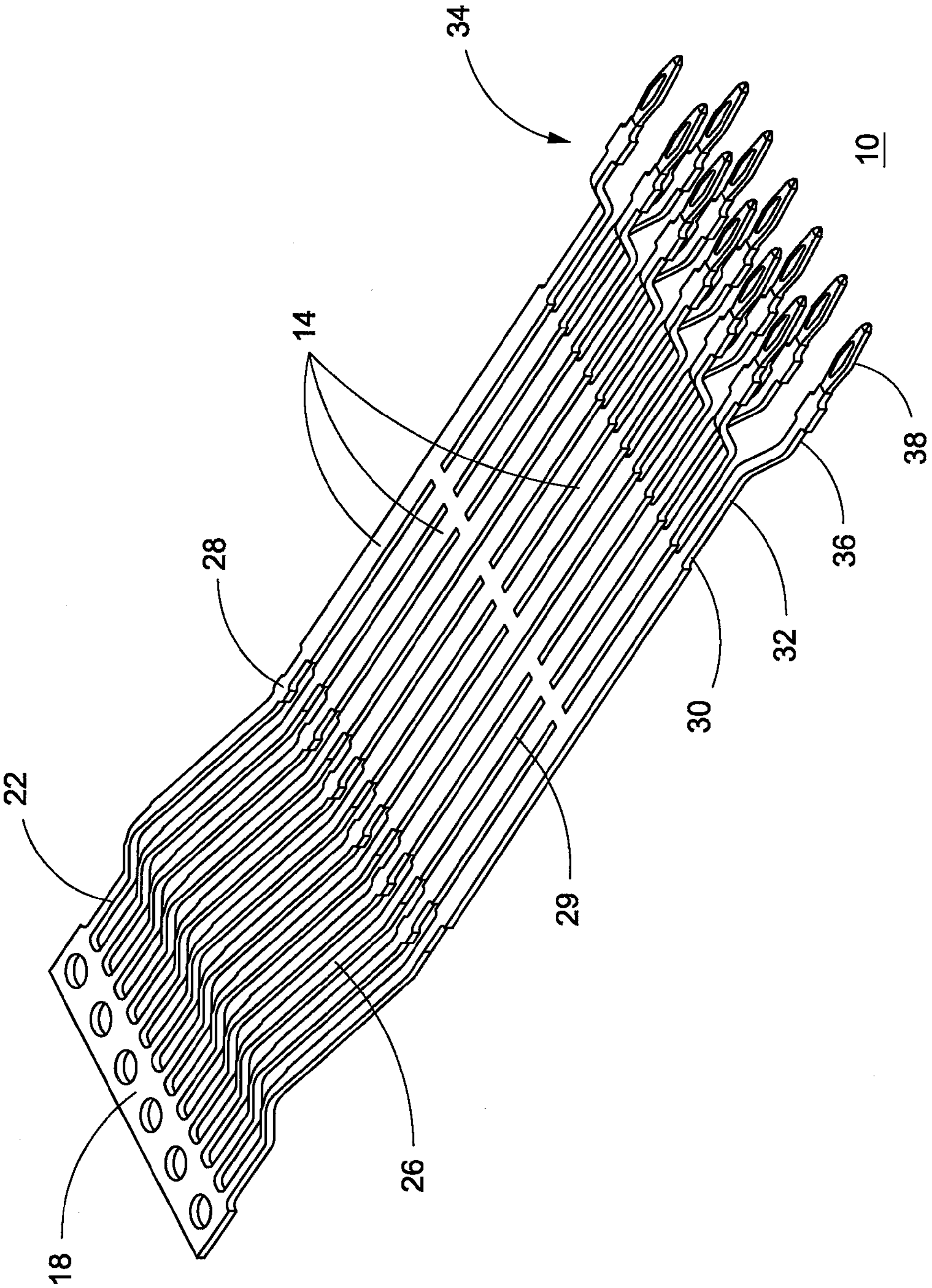
FIG. 1 is an isometric view of an embodiment of a first leadframe of electrical contacts as stamped and plated.

A first embodiment leadframe 10 of electrical contacts 14 may be stamped from a sheet of electrically conductive material, such as copper alloy, for example. FIG. 1 depicts the leadframe 10 of electrical contacts 14 attached to one another and to a carrier frame 18. Each contact 14 may include a mating end 22, a mating portion 26, a first housing portion 28, a lead portion 29, a second housing portion 30, a third housing portion 32, a mounting portion 34, and a mounting end 36. The lead portions 29 of the contacts may be attached to one another via "bridges" that remain after stamping. The mounting ends 36 of the contacts may each include a tail 38. The contacts 14 may be selectively gold plated.

Once the leadframe 10 has been stamped, a first leadframe housing 42 may be overmolded onto the first housing portions 28 of the contacts 14. A second leadframe housing 46 may be overmolded onto the second housing portions 30 of the contacts. Each leadframe housing may be made of a dielectric material, such as a plastic. Both housings may be overmolded onto the leadframe 10 in a single molding process using well-known techniques.

Figure 2:
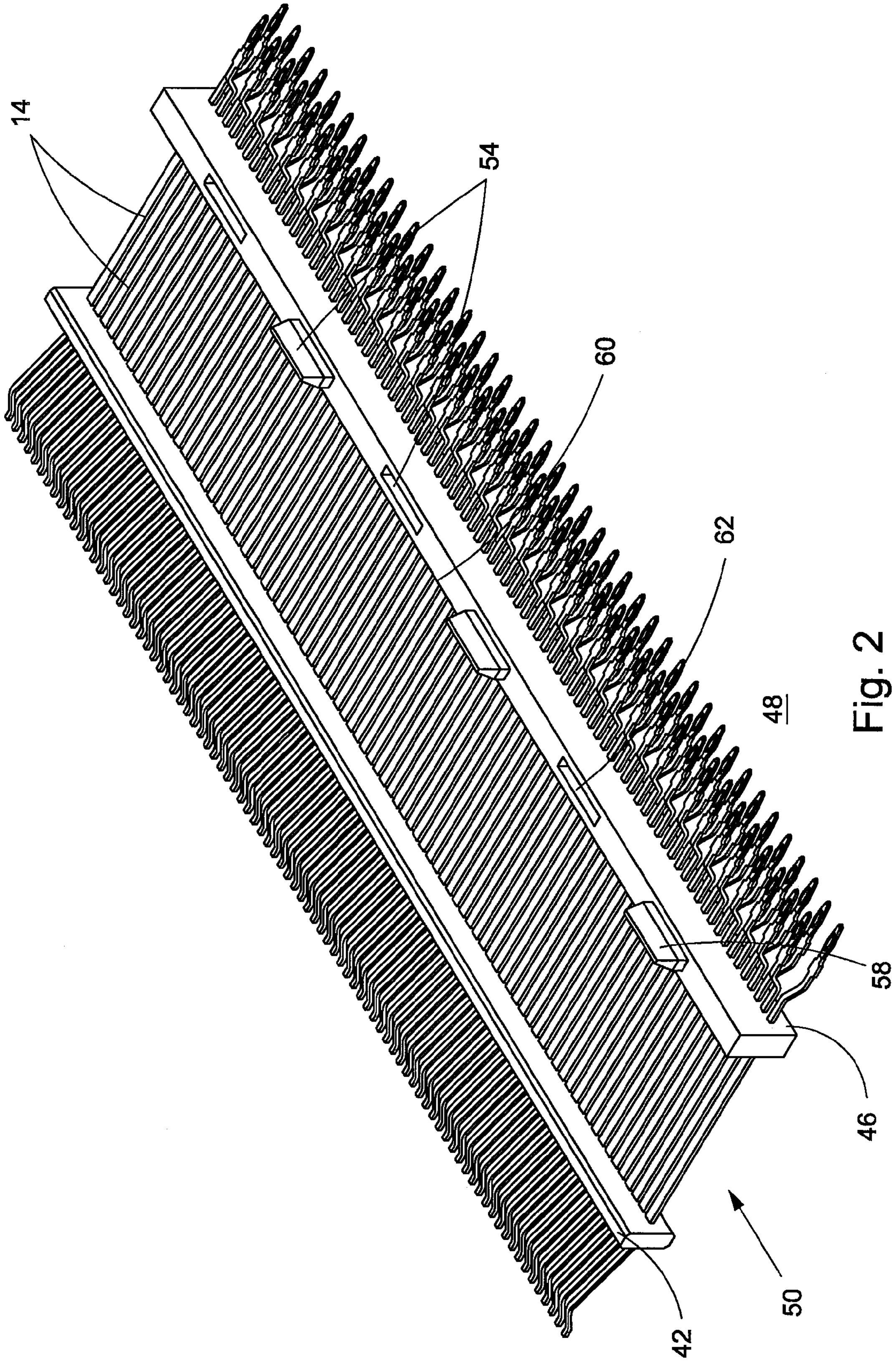
FIG. 2 is an isometric view of a first leadframe assembly after molding.

FIG. 2 depicts a first leadframe assembly 48 after the first leadframe housing 42 and the second leadframe housing 46 have been overmolded onto the electrical contacts 14, with the carrier frame 18 shown in FIG. 1 removed. As shown, a linear array 50, or "row," of electrical contacts 14 may extend through each of the first leadframe housing 42 and the second leadframe housings 46.

The second housing 46 may include one or more interlock members 54. As shown, each interlock member 54 may be a protrusion 58 that extends from a face 60 of the housing 46, or a recess 62 defined by the leadframe housing 46. Each recess 62 is adapted to receive a complementary protrusion extending from a leadframe housing of a second leadframe assembly and each protrusion 58 is adapted to be received in a complementary recess defined by the leadframe housing of the second leadframe assembly. The interlock members 54 will be described in more detail in connection with FIG. 8.

Figure 3:
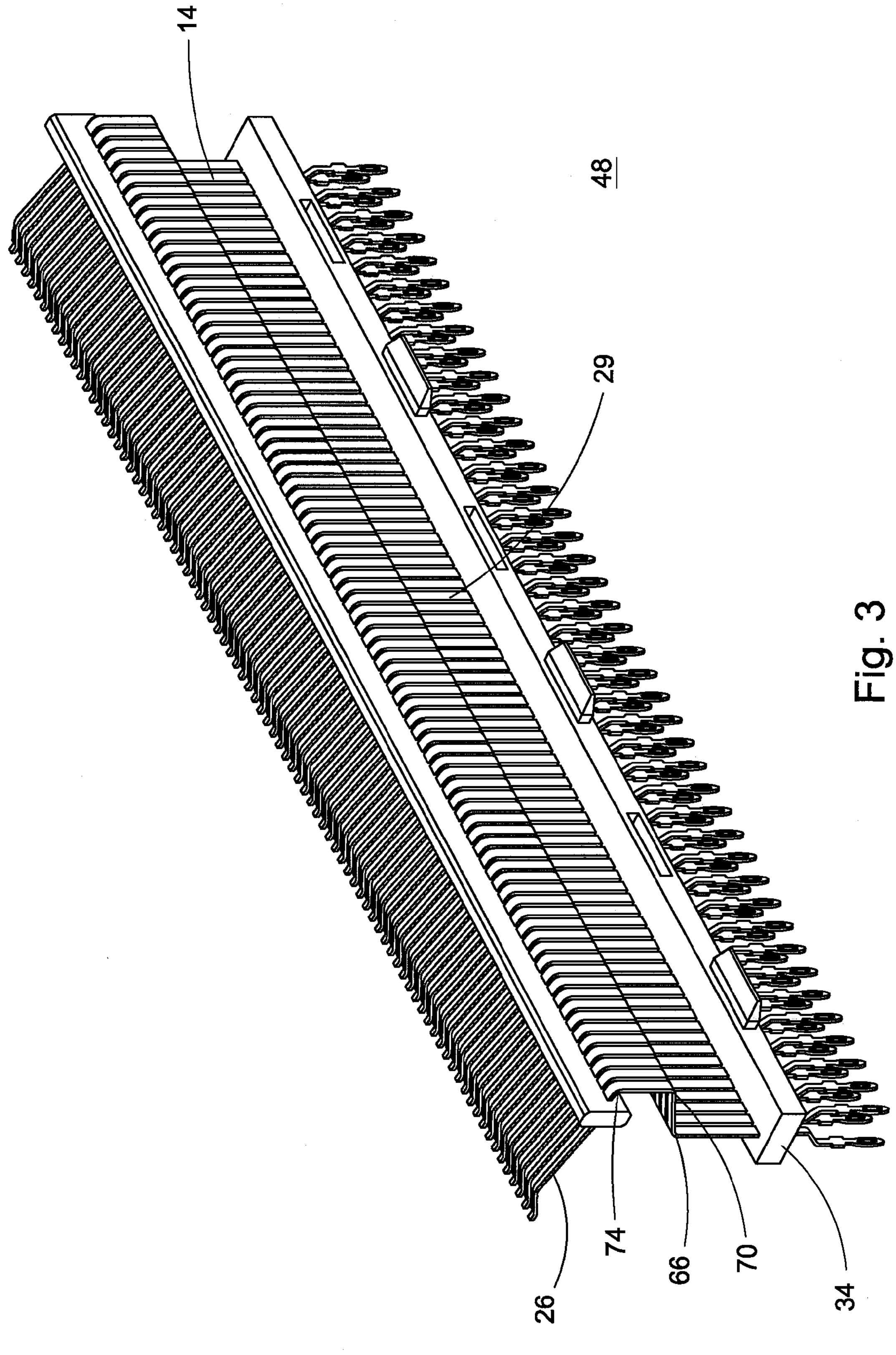
FIG. 3 is an isometric view of the leadframe assembly of FIG. 2 after forming and slugout.

After the leadframe housings are overmolded onto the leadframe 10, the bridges that attach the contacts 14 to one another may be "slugged out." The contacts 14 may be formed into any desired shape. FIG. 3 depicts an example embodiment of a leadframe assembly 48 after slug out and formation of the contacts 14. As shown, the lead portions 29 may be bent to a first angle (e.g., 90°) at a first bend point 66, to a second angle (e.g., 90°) at a second bend point 70, and to a third angle (e.g., 90°) at a third bend point 74. Thus, the lead portions 29 may be bent to include respective C-shaped portions that culminate in the respective mating portions 26 of the contacts 14. Consequently, the mating portions 26 of the contacts 14 may extend along a plane that is generally perpendicular to the plane along which the mounting portions 34 of the contacts 14 extend. In other words, the mating portions 26 of the contacts 14 may extend generally perpendicular to the mounting portions 34 of the contacts 14.

Figure 4:
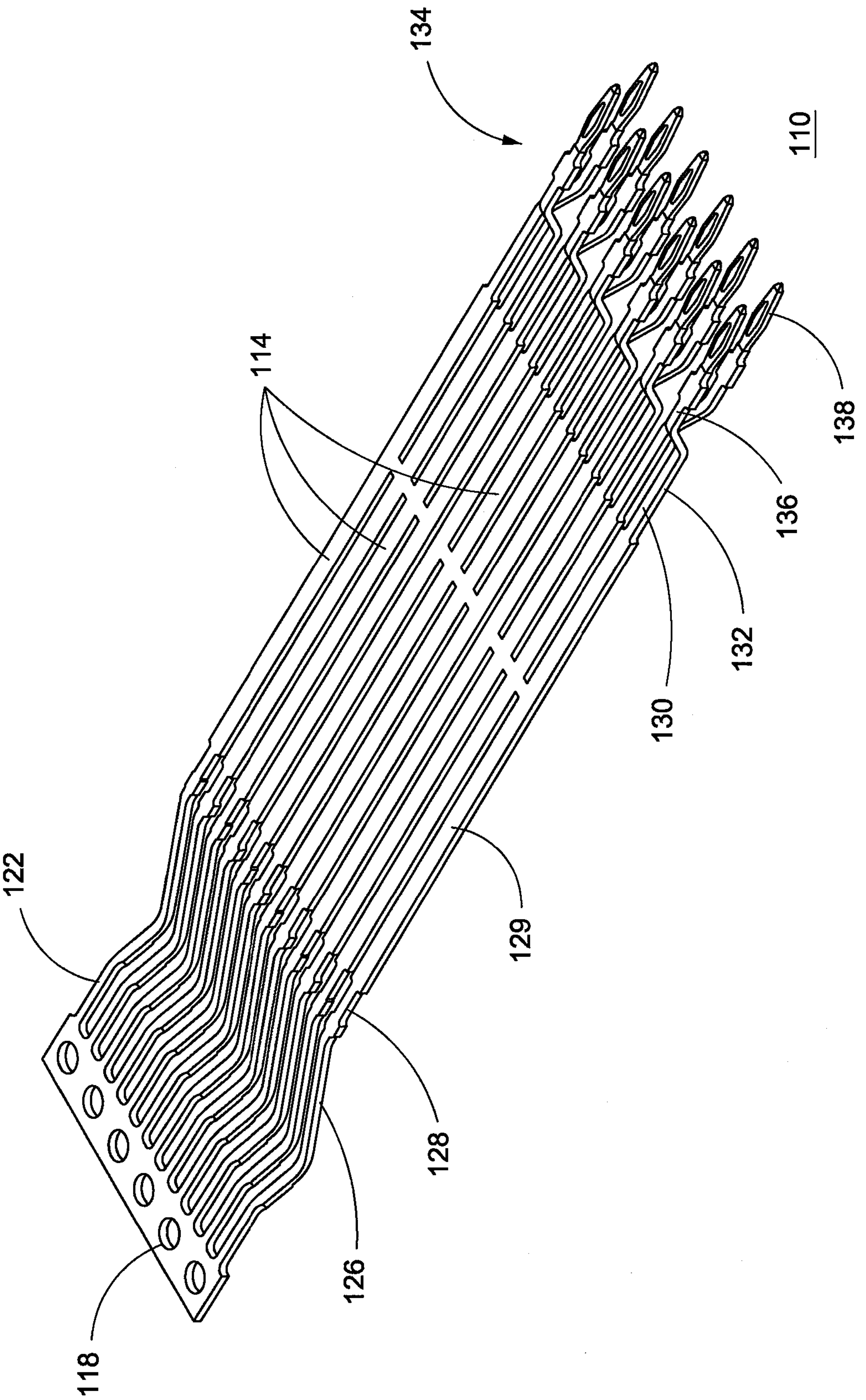
FIG. 4 is an isometric view of an embodiment of a second leadframe of electrical contacts as stamped and plated.

A second embodiment leadframe 110 of electrical contacts 114 may be stamped from a sheet of electrically conductive material, such as copper alloy, for example. FIG. 4, depicts the leadframe 110 of electrical contacts 114 attached to one another and to a carrier frame 118. Each contact 114 may include a mating end 122, a mating portion 126, a first housing portion 128, a lead portion 129, a second housing portion 130, a third housing portion 132, a mounting portion 134, and a mounting end 136. The lead portions 129 of the contacts 114 may be attached to one another via "bridges" that remain after stamping. The mounting ends 136 of the contacts 114 may each include a tail 138. The contacts 114 may be selectively gold plated.

After the leadframe 110 has been stamped, a first leadframe housing 142 may be overmolded onto the first housing portions 128 of the contacts 114. A second leadframe housing 146 may be overmolded onto the second housing portions 130 of the contacts 114. Each leadframe housing 142/146 may be made of a dielectric material, such as a plastic. Both the first leadframe housing 142 and the second leadframe housing 146 may be overmolded onto the leadframe 110 in a single molding process using well-known techniques.

Figure 5:
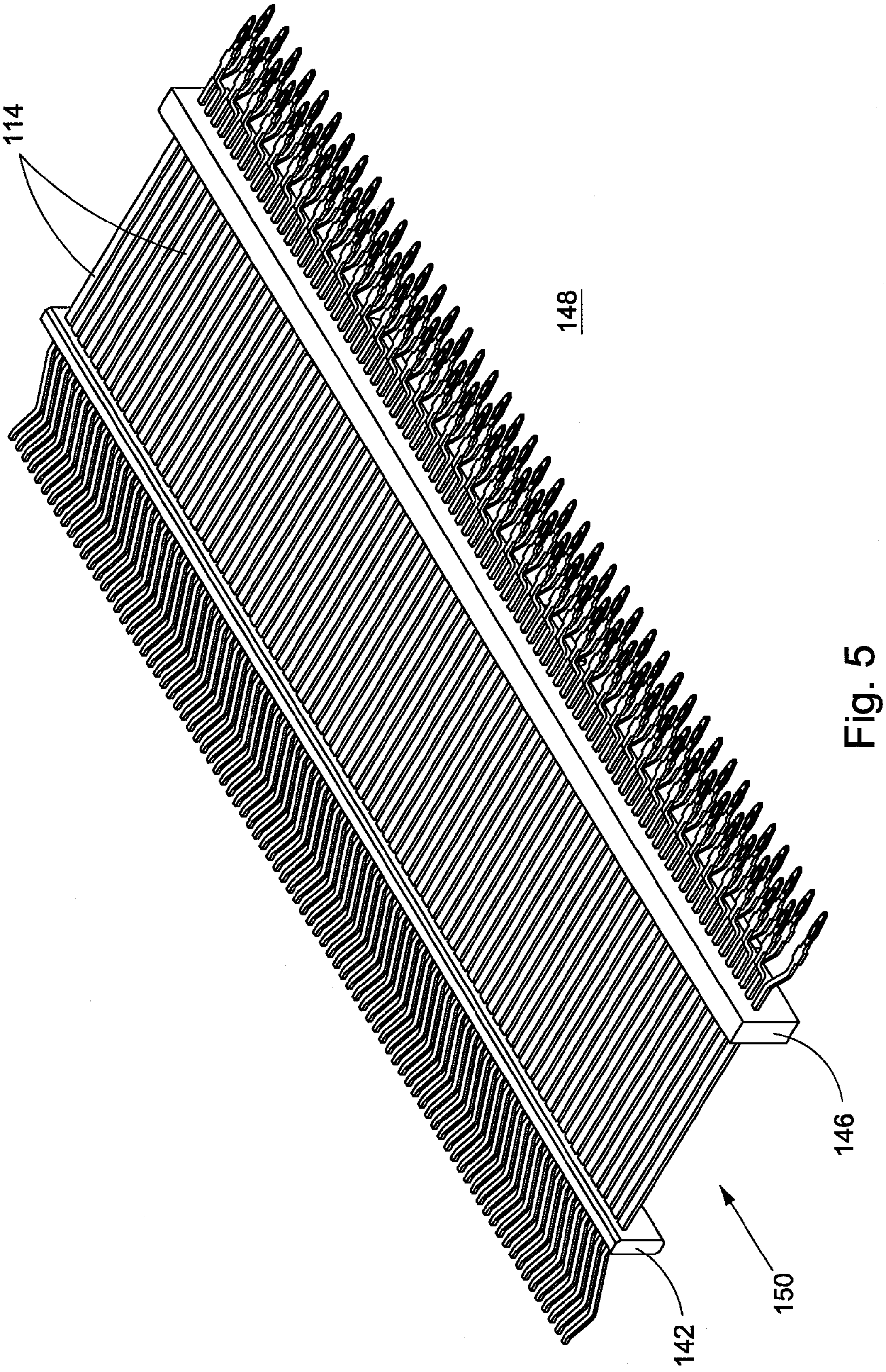
FIG. 5 is an isometric view of a second leadframe assembly after molding.

FIG. 5 depicts a second leadframe assembly 148 after the first leadframe housing 142 and the second leadframe housing 146 have been overmolded onto the electrical contacts 114, with the carrier frame 118 shown in FIG. 4 removed. As shown, a linear array 150, or "row," of electrical contacts 114 may extend through each of the first leadframe housing 142 and the second leadframe housing 146.

The second housing 146 may include one or more interlock members similar to those described in connection with FIG. 2. As described above in connection with FIG. 2, each interlock member may be a protrusion that extends from a face of the second leadframe housing, or a recess defined by the second leadframe housing. Each recess may be adapted to receive the complementary protrusion 58 extending from the second leadframe housing 46 of the first leadframe assembly 48 (see FIG. 3), and each protrusion may be adapted to be received in a complementary recess 62 defined by the second leadframe housing 46 of the first leadframe assembly 48 (see FIG. 3). The interlock members will be described in more detail in connection with FIG. 8.

Figure 6:
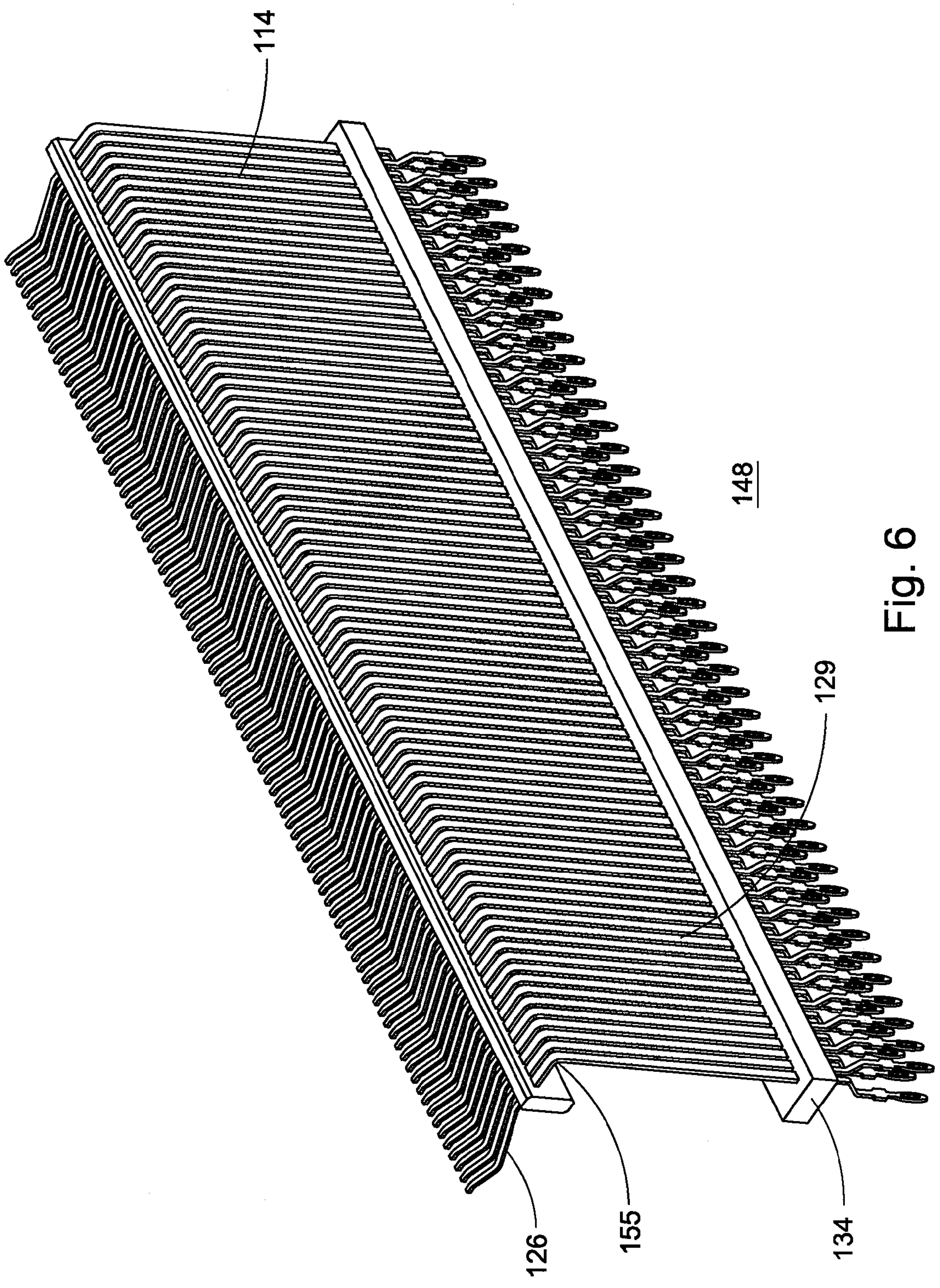
FIG. 6 is an isometric view of the leadframe assembly of FIG. 5 after forming and slugout.

After the first leadframe housing 142 and the second leadframe housing 146 are overmolded onto the leadframe 110, the bridges that attach the contacts 114 to one another may be "slugged out." The contacts 114 may be formed into any desired shape. FIG. 6 depicts an example embodiment of the leadframe assembly 148 after slug out and formation of the contacts 114. As shown, the lead portions 129 may be bent to an angle (e.g., 90°) at a bend point 155. Thus, the lead portions 129 may be bent to include respective L-shaped portions that culminate in the respective mating portions 126 of the contacts 114. Consequently, the mating portions 126 of the contacts 114 may extend along a plane that is generally perpendicular to the plane along which the mounting portions 134 of the contacts 114 extend. In other words, the mating portions 126 of the contacts 114 may extend generally perpendicular to the mounting portions 134 of the contacts 114.

Figure 7A:
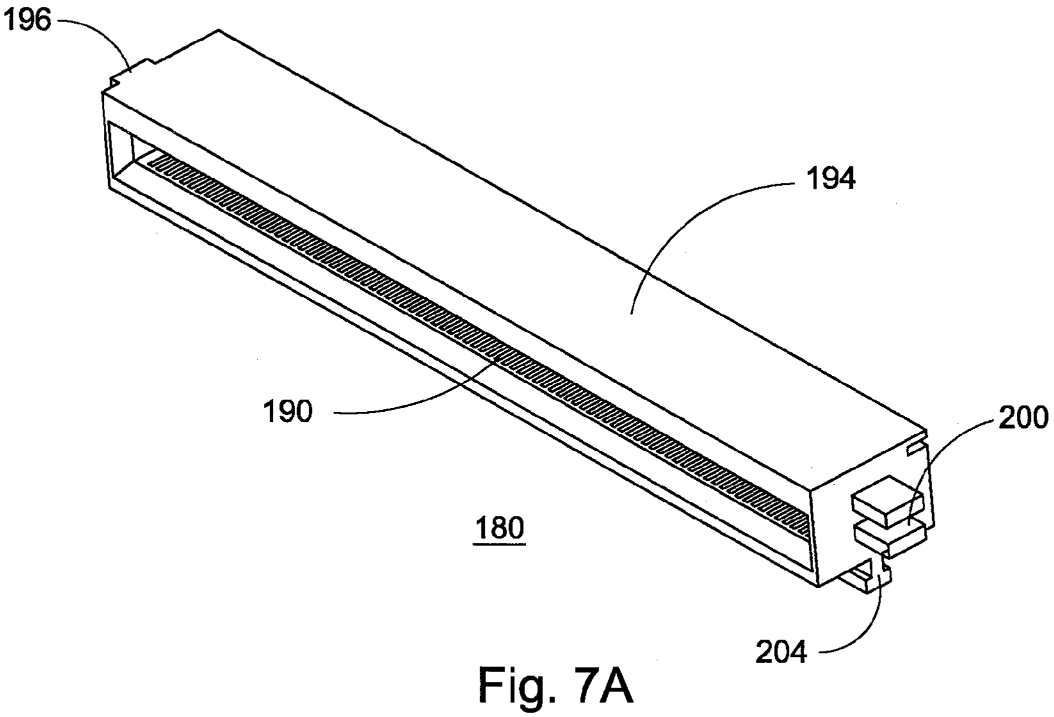
FIGS. 7A and 7B are isometric views of an embodiment of an edge card housing.
Figure 7B:
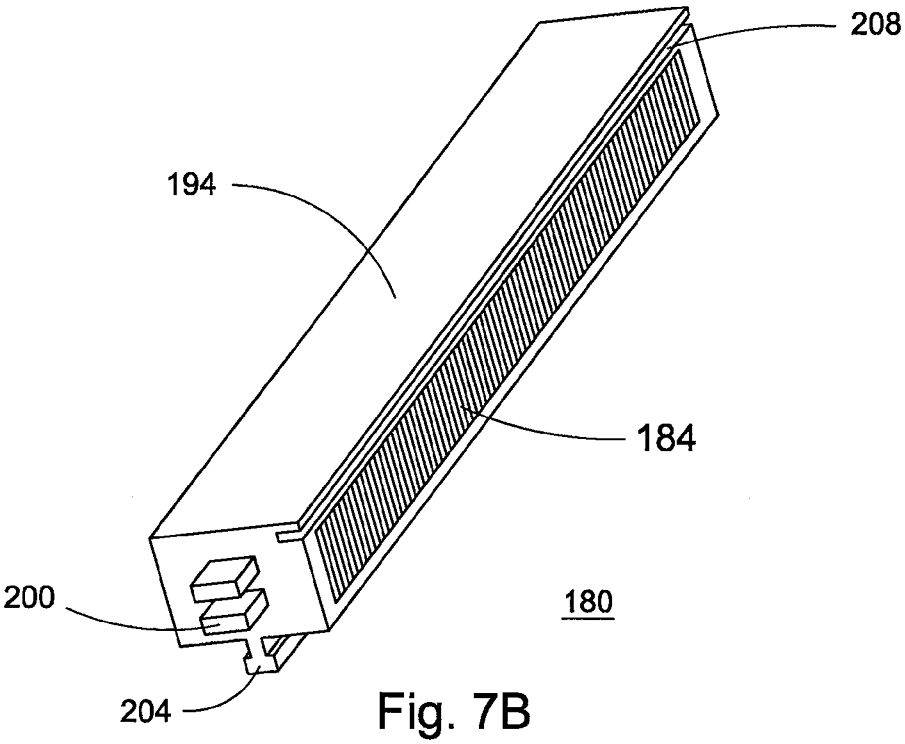

The mating portions 26 of the first leadframe assembly 48 and the mating portions 126 of the second leadframe assembly 148 may then be inserted into an edge card housing 180. FIGS. 7A and 7B depict an example edge card housing 180. The edge card housing 180 may be made of a dielectric material, such as a plastic. The edge card housing 180 may include a row of receptacles 184, a card slot 190, an edge card body 194, a first protrusion 196 extending from the left side of the edge card body 194, a second protrusion 200 extending from the right side of the edge card body 194, a third protrusion 204 extending from the bottom of the edge card body 194 and a recess 208 formed in the back side of the edge card body 194. The first 196, second 200, and third 204 protrusions may be capable of being received by recesses formed in a connector housing. The recess 208 may be capable of receiving a protrusion extending from a connector housing. The housing will be explained in more detail in connection with FIGS. 13 and 14. In the embodiment shown in FIGS. 7A and 7B, the first protrusion 196 and the second protrusion 200 may each consist of two snap-fit members, and the third protrusion 204 may consist of a T-beam or dove tail. The recess 208 formed in the back side may be a slot. The edge card 180 is not limited to the disclosed embodiment and may incorporate different designs and structures.

Figure 8:
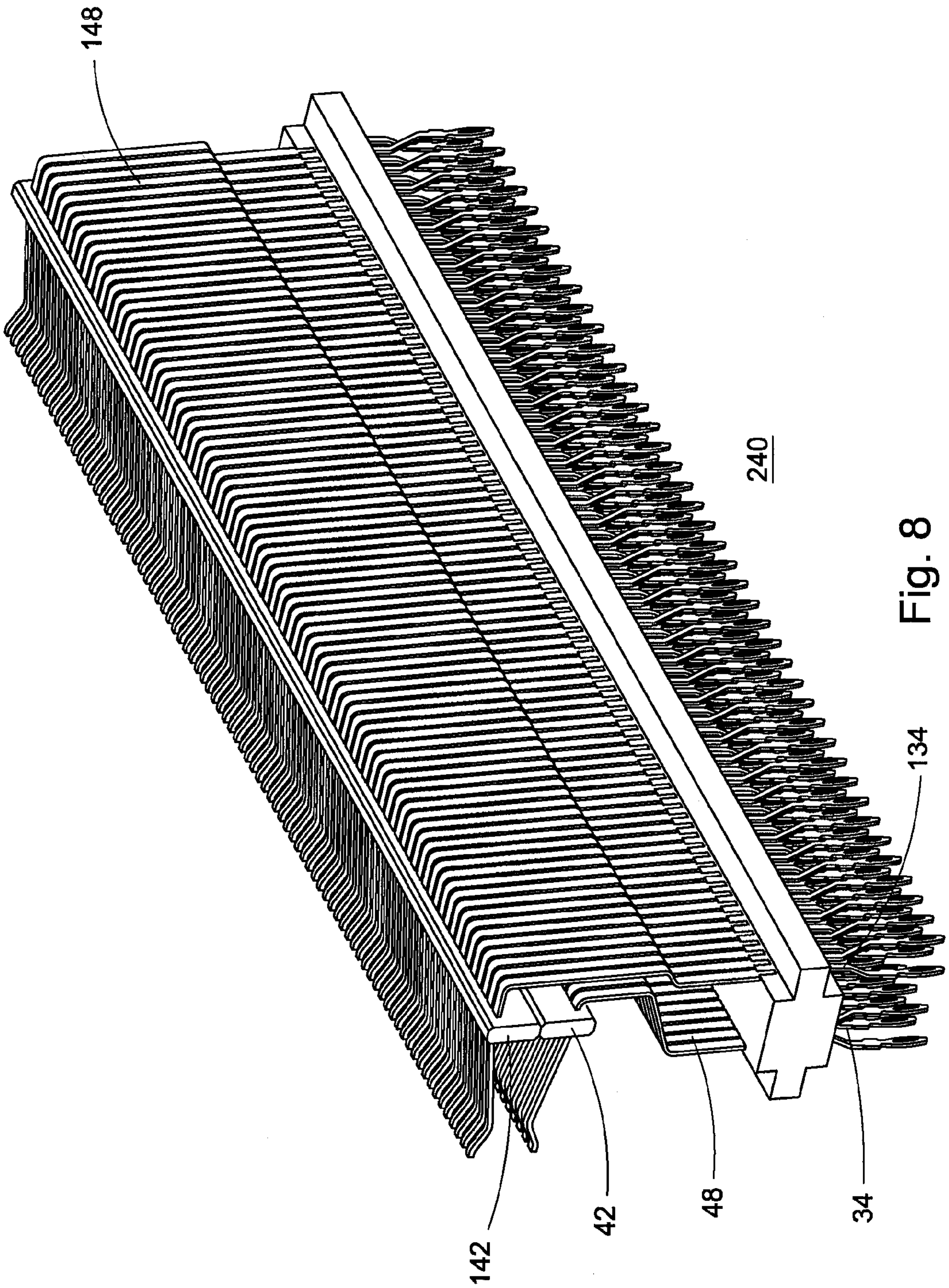
FIG. 8 is an isometric view of an embodiment of a complete assembly prior to insertion into the edge card housing.

FIG. 8 depicts an embodiment of the first leadframe assembly 48 and the second leadframe assembly 148 interlocked together creating a complete assembly 240. Each recess 62 (as shown in FIG. 3) of the first leadframe assembly 48 may receive the respective protrusion from the second leadframe assembly 148 and each recess of the second leadframe assembly 148 may receive the respective protrusion 58 (as shown in FIG. 3) from the first leadframe assembly 48. As shown, the first leadframe housing 142 of the second leadframe assembly 148 may rest on or connect to the first leadframe housing 42 of the first leadframe assembly 48. When the first leadframe assembly 48 and the second leadframe assembly 148 are combined, the mounting portions 34/134 of each leadframe assembly may be parallel.

The first leadframe assembly 48 may be inserted into the edge card housing 180. That is, the mating portions 26 of the contacts 14 of the first leadframe assembly 48 may be received into the row of receptacles 184 defined by the edge card housing 180.

Figure 9:
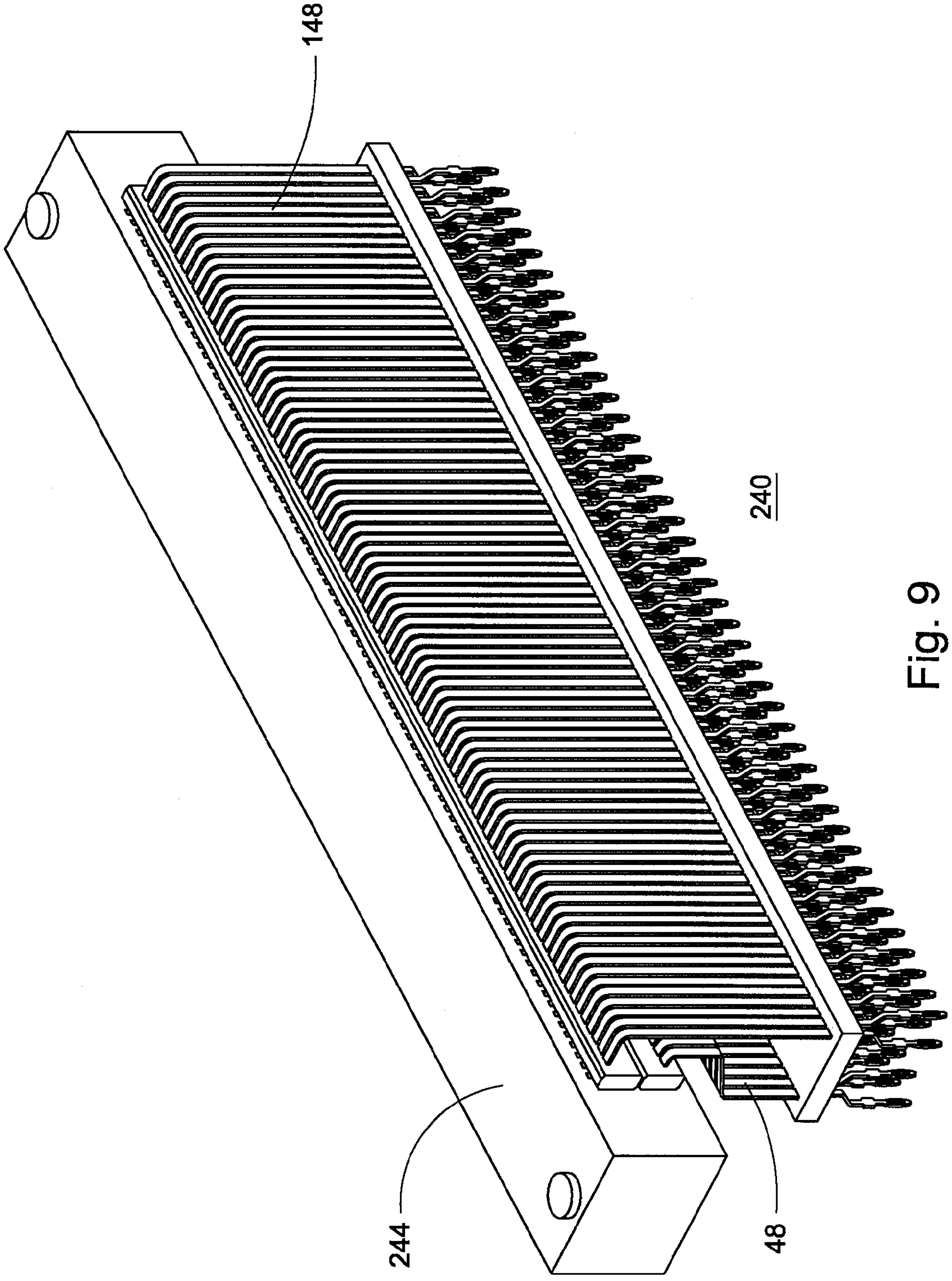
FIG. 9 is an isometric view of the complete assembly of FIG. 8 with an edge card housing added.

The second leadframe assembly 148 may be inserted into the edge card housing 180. That is, the mating portions 126 of the contacts 114 of the second leadframe assembly 148 may be received into the row of receptacles 184 defined by the edge card housing 180. FIG. 9 depicts an embodiment of the complete assembly 240 with both leadframe assemblies inserted into an example edge card housing 244.

Figure 10:
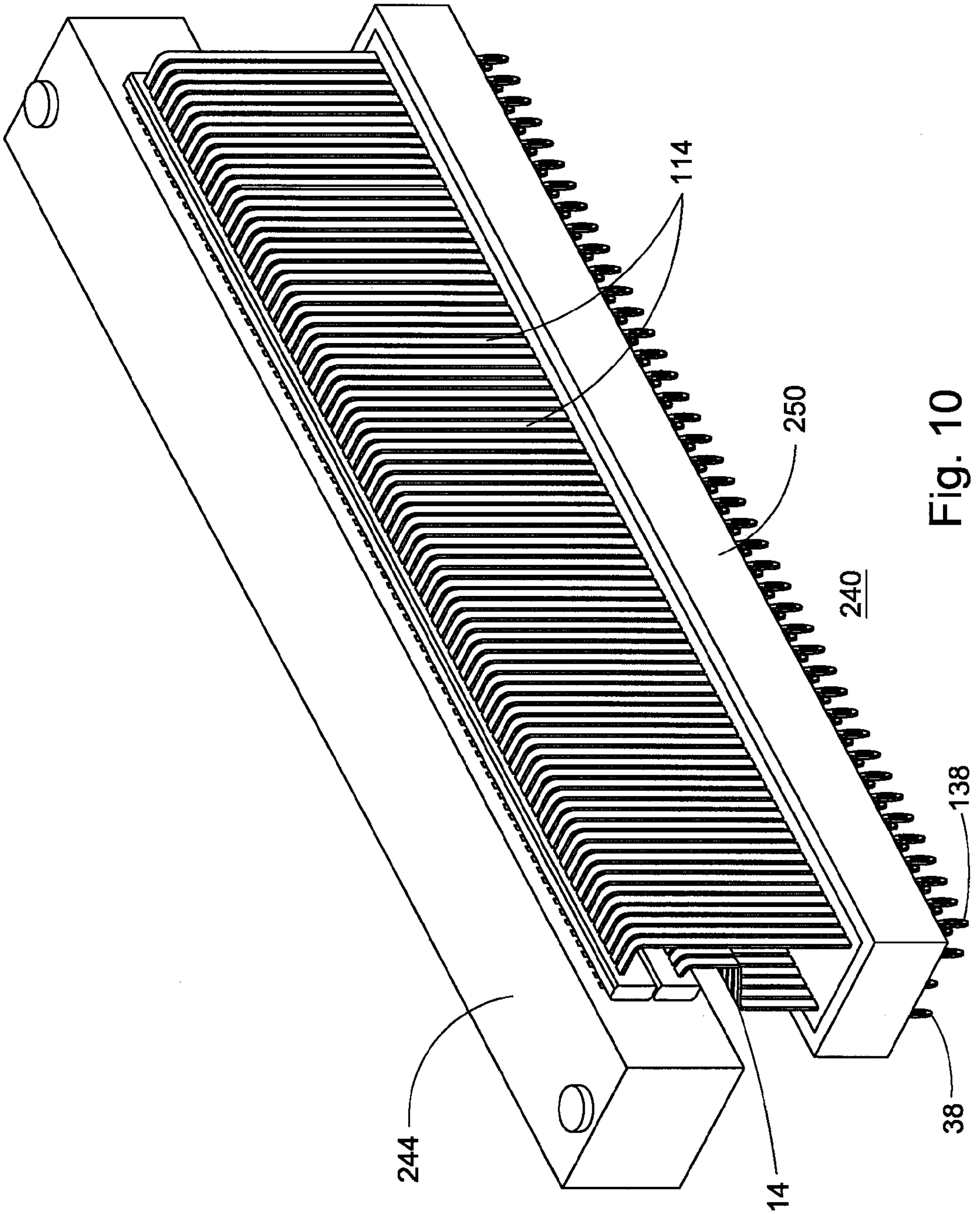
FIG. 10 depicts the complete assembly of FIG. 9 after a second overmold process.
Figure 12:
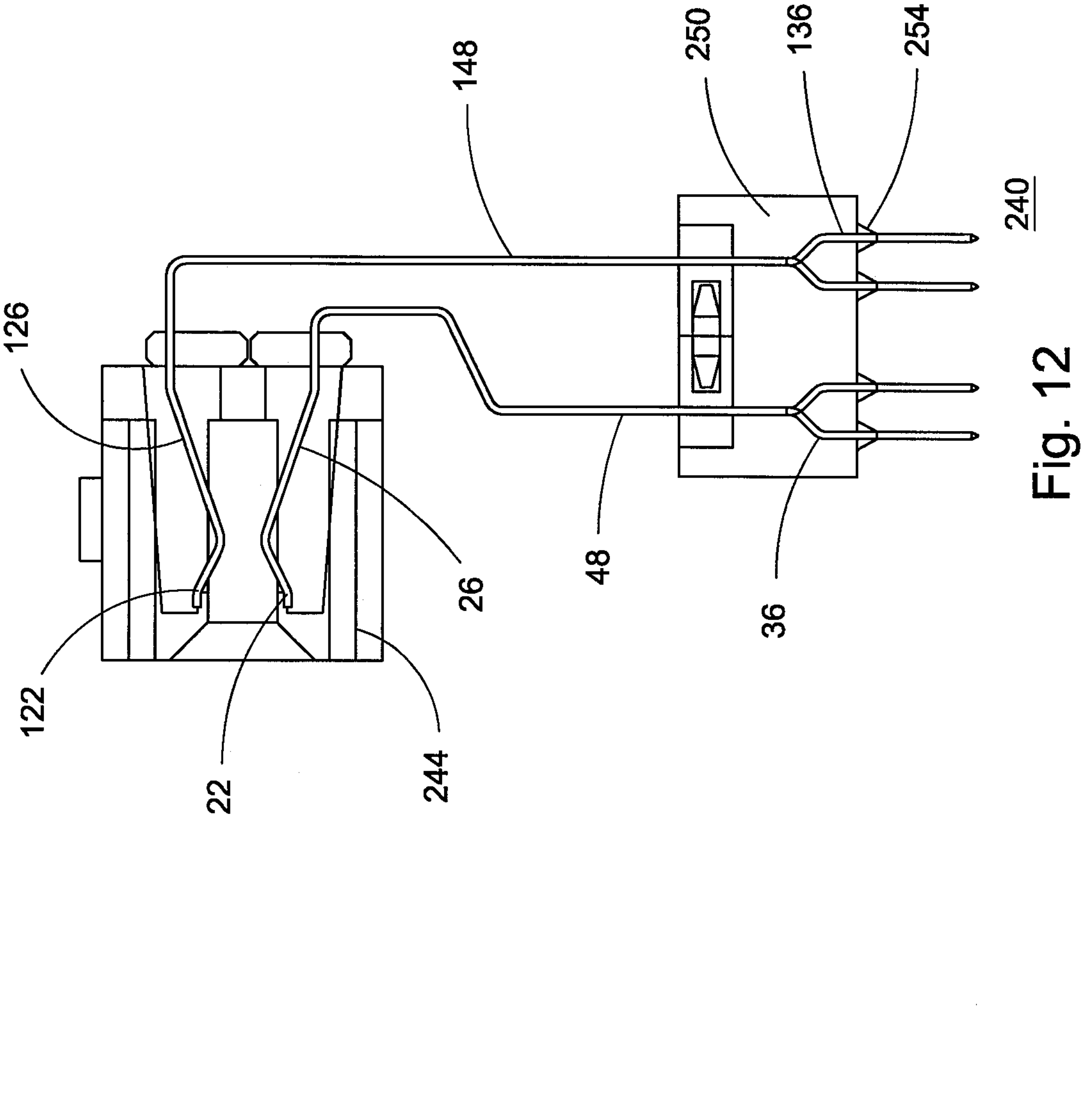
FIG. 12 is a cross-sectional view of the complete assembly of FIG. 10.

After the leadframe assemblies have been inserted into the edge card housing 180, a tail alignment housing 250 may be overmolded onto the third housing portions 32/132 of the contacts 14/114, using well-known injection molding techniques. The tail alignment housing 250 may be made of a dielectric material, such as a plastic. FIG. 10 depicts an embodiment of the complete assembly 240 after the second overmold process. As shown, the tail alignment housing 250 may extend up a portion of the mounting ends 36/136 (as shown in FIG. 12) of both leadframe assemblies. Therefore, the tail alignment housing 250 may serve to control the position of the tails 38/138 of the mounting ends 36/136 and may provide a structure to transfer the forces for press fit of the connector to the PCB.

Figure 11A:
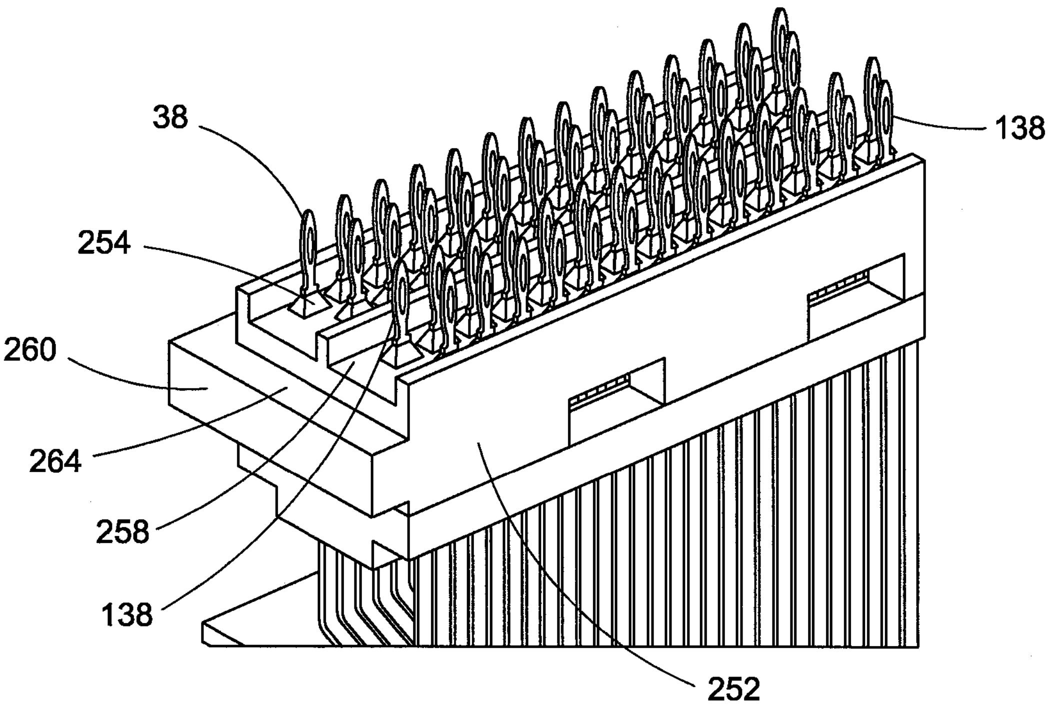
FIGS. 11A and 11B are isometric views of a portion of the complete assembly of FIG. 10.
Figure 11B:
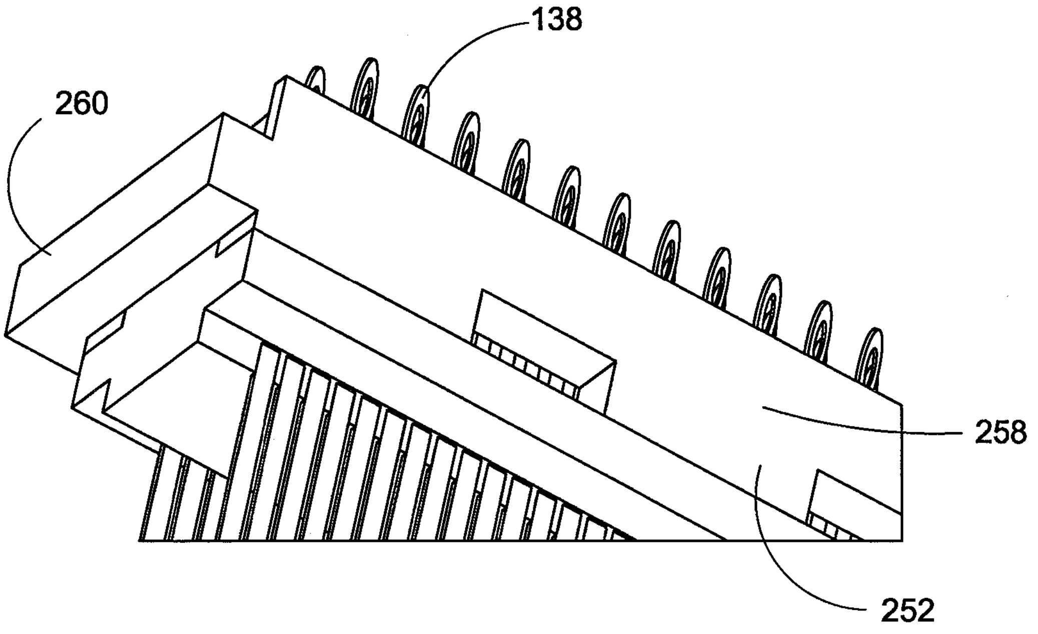
Figure 11C:
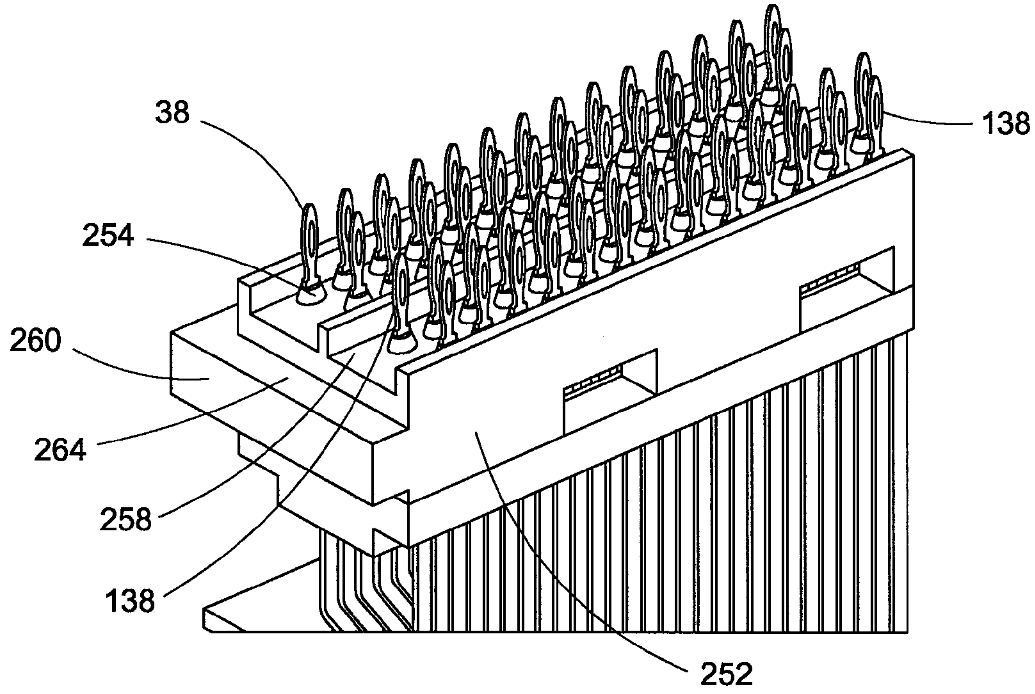
FIG. 11C is an isometric view of the portion of the complete assembly similar to FIG. 11A, but constructed in accordance with another embodiment.

As shown in FIGS. 11A and 11B, an embodiment of a tail alignment housing 252 may include a plurality of tail supports 254 extending from a body 258 of the tail alignment housing 252 up and around the mounting ends 36/136, that may help further control the position of the tails 38/138 and may provide further structure to the connector. The tail supports 254 may take the shape of pyramids, as shown in FIGS. 11A and 11B but are not limited to such a design. For example, the supports may also be cones as illustrated in FIG. 11C, squares, rectangles, or any other designs capable of controlling the position of the tails 38/138. The tail alignment housing 252 may also have a first protrusion 260 extending from a left side 264 and a second protrusion 268 (shown in FIG. 13) extending from a right side 270. The protrusions may be received by recesses formed in the connector housing.

FIG. 12 depicts a cross-sectional view of the complete assembly 240 after the second overmold process, showing how the contacts may be oriented within the edge card 244, and the tail alignment housing 250. As shown, the mating portions 26 of the first leadframe assembly 48 may angle in a substantially upward direction within the edge card 244, and the mating portions 126 of the second leadframe assembly 148 may angle in a substantially downward direction within the edge card 244. Furthermore the mating ends 22 of the first leadframe assembly 48 may angle in a substantially downward direction, and the mating ends 122 of the second leadframe assembly 148 may angle in a substantially upward direction. Generally, the mating ends may extend toward the card slot of the edge card 244. Also shown in FIG. 12, are the orientations of the mounting ends 36/136 of the first leadframe assembly 48 and of the second leadframe assembly 148 within the tail alignment housing 252.

A connector housing may also be added to the complete assembly. The connector housing may be made of a dielectric material such as a plastic. In one embodiment, the connector housing may be separated into two pieces; a left connector housing 274 and a right connector housing 278. The left connector housing 274 may have a front wall portion 280 having a recess (not shown), a left side wall 286 having a recess (not shown), and a back wall portion 294 having a protrusion 296. The right connector housing 278 may have a front wall portion 298 having a recess (not shown), a right side wall 304 having a recess 306, and a back wall portion 308 having a protrusion (not shown). The left side wall 286 and the right sidewall 304 may also extend below their respective front wall portions and back wall portions. Each extended portion may have a recess 314 and 316 respectively, capable of receiving the first protrusion 260 and second protrusion 268 extending from the left side 264 and right side 270 respectively of the tail alignment housing 252. The housing is not limited to such a design and may include other configurations.

Figure 13:
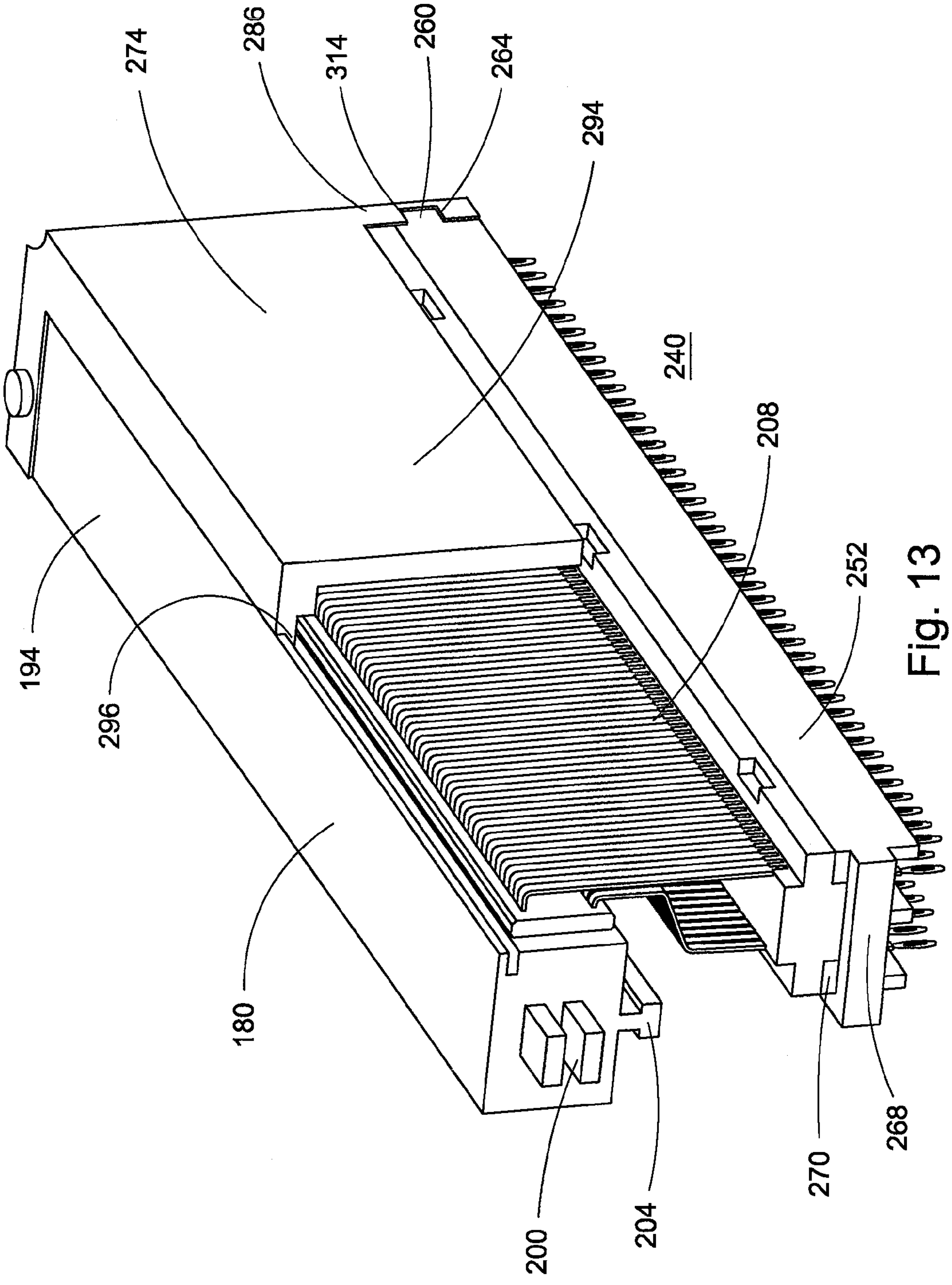
FIG. 13 is an isometric view of the complete assembly of FIG. 10 with a left connector housing added.

As shown in FIG. 13, an embodiment of the left connector housing 274 may be placed onto the complete assembly 240, interlocking the left connector housing 274 to the edge card housing 180. The first protrusion 196 (as shown in FIG. 7A) extending from the left side of the edge card body 194 may interlock with the recess formed in the left side wall 286 of the left connector housing 274. A portion of the third protrusion 204 extending from the bottom of the edge card body 194 may interlock with the recess formed in the front wall portion 280 (shown in FIG. 15) of the left connector housing 274. The protrusion 296 extending from the back wall portion 294 of the left connector housing 274 may interlock with a portion of the recess 208 formed in the back side of the edge card body 194. The connection with the back side of the edge card body 194 may have a tongue and groove fit. The recess 314 formed in the extended portion of the left sidewall 286 may interlock with the protrusion 260 extending from the left side 264 of the tail alignment housing 252.

Figure 14:
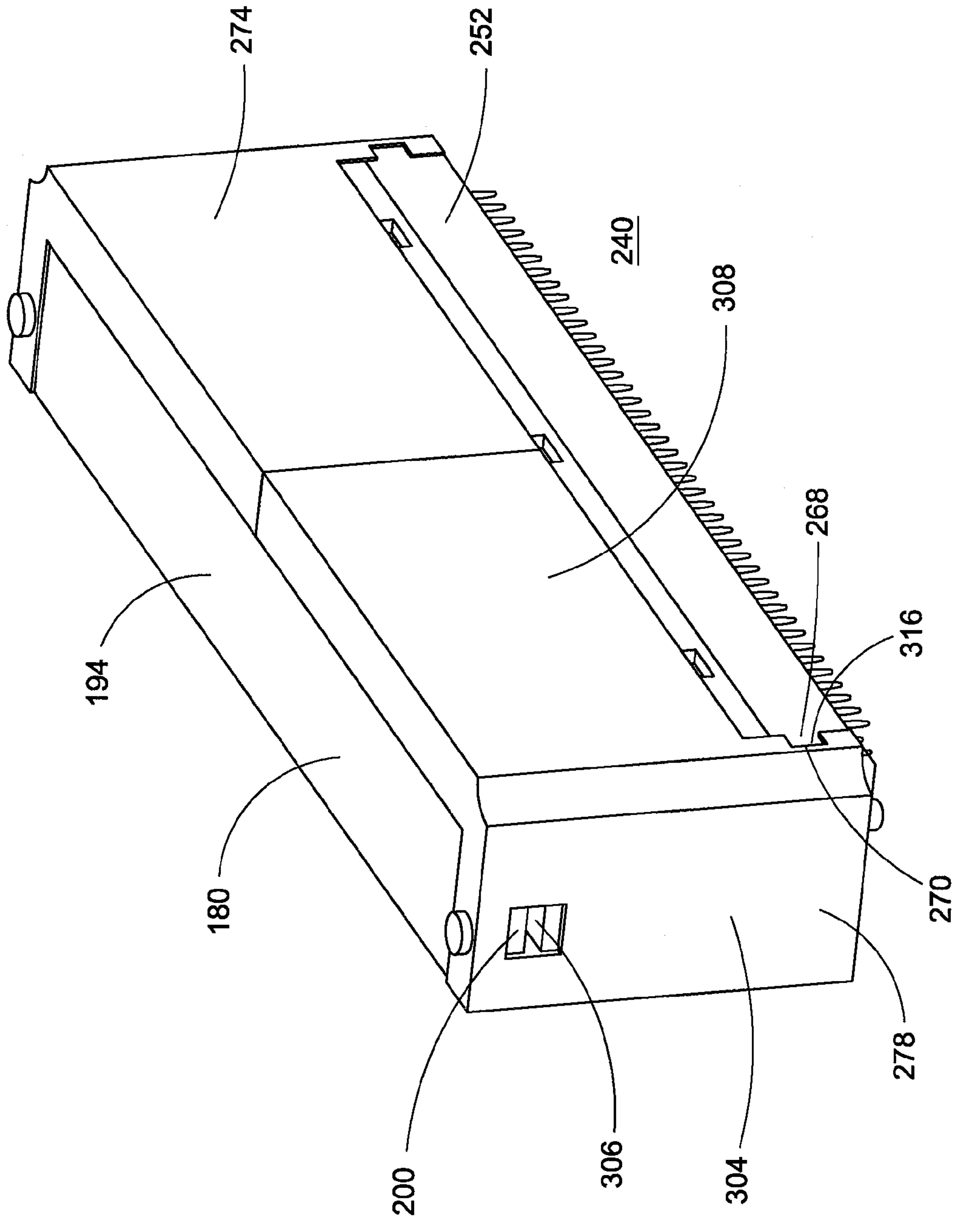
FIG. 14 is an isometric view of the complete assembly of FIG. 13 with a right connector housing added.

As shown in FIG. 14, an embodiment of the right connector housing 278 may be placed onto the complete assembly 240, interlocking the right connector housing 278 to the edge card housing 180. The second protrusion 200 extending from the right side of the edge card body 194 may interlock with the recess 306 formed in the right side wall 304 of the right connector housing 278. A portion of the third protrusion 204 (as shown in FIG. 7A) extending from the bottom of the edge card body 194 may interlock with the recess formed in the front wall portion 298 (shown in FIG. 15) of the right connector housing 278. The protrusion extending from the back wall of the right connector housing 278 may interlock with a portion of the recess 208 (shown in FIG. 7B) formed in the back side of the edge card body 194. The connection with the back side of the edge card body 194 may have a tongue and groove fit. The recess 316 formed in the extended portion of the right sidewall 304 may interlock with the protrusion 268 extending from the right side 270 of the tail alignment housing 252.

Figure 15:
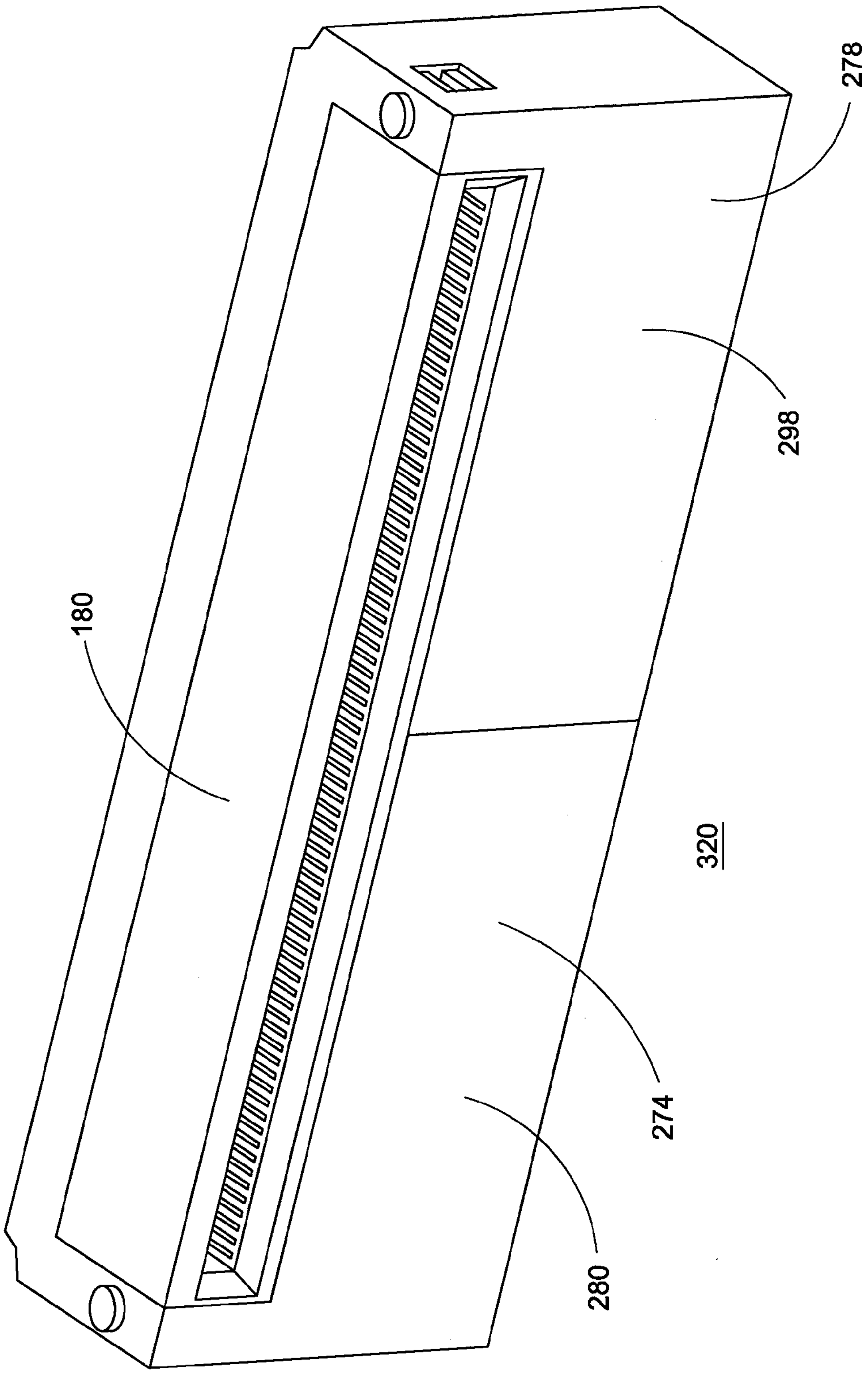
FIG. 15 is an isometric view of an embodiment of a complete connector.

FIG. 15 depicts a front view of an embodiment of a completed connector 320. The front wall 280 of the left connector housing 274 and the front wall 298 of the right connector housing 278 may be seen. By having the right connector housing 278 and the left connector housing 274 interlock with the edge card housing 180, extra strength may be added to the edge card housing 180 to help withstand the force of "over-mating."

What is claimed:

1. A connector comprising:

a first leadframe assembly comprising a first plurality of electrical contacts, wherein each of the first plurality of contacts defines a respective mating end, a respective mounting end, and a respective lead portion extending between the mating end and the mounting end, the first leadframe assembly further comprising a first leadframe housing overmolded onto the first plurality of electrical contacts;

a second leadframe assembly comprising a second plurality of electrical contacts, wherein each of the second plurality of contacts defines a respective mating end, a respective mounting end, and a respective lead portion extending between the mating end and the mounting end, the second leadframe assembly further comprising a second leadframe housing overmolded onto the second plurality of electrical contacts, wherein the first leadframe housing is adapted to couple to the second leadframe housing; and a tail-alignment housing having a housing body and a plurality of tail supports that extend from the housing body, wherein each of the plurality of tail supports is overmolded onto a respective one of the contact mounting ends, and the tail supports do not couple the first leadframe housing to the second leadframe housing.

2. The connector of claim 1, wherein each tail support has a pyramidal shape.

3. The connector of claim 1, wherein the tail alignment housing is made of plastic.

4. The connector of claim 1, wherein each mounting end includes a respective tail and the tail supports extend up the mounting ends to a point substantially near the tails.

5. The connector of claim 1, wherein the connector is an advanced mezzanine card connector.

6. The connector of claim 1, wherein the tail alignment housing includes a protrusion extending from a right side of the housing and a protrusion extending from a left side of the housing.

7. The electrical connector of claim 1, wherein the tail alignment housing is overmolded onto the first and second leadframe housings.

8. The electrical connector of claim 1, further comprising an edge card housing, wherein (i) the edge card housing defines a plurality of receptacles, and (ii) the mating ends of the first and second pluralities of electrical contacts are received in the receptacles.

9. The electrical connector of claim 8, further comprising a first connector housing and a second connector housing, wherein each of the first and second connector housings is adapted to couple to both the edge card housing and the tail alignment housing.

10. The electrical connector of claim 9, wherein (i) the edge card housing comprises an edge card body, a first protrusion extending from a first side of the edge card body, a second protrusion extending from a second side of the edge card body, and a third protrusion extending from a third side of the edge card body, (ii) the first connector housing comprises a first wall portion and a second wall portion (iii) the second connector housing comprises a first wall portion and a second wall portion, (iv) the first wall portion of the first connector housing defines a recess for receiving the first protrusion of the edge card housing, (v) the first wall portion of the second connector housing defines a recess for receiving the second protrusion of the edge card housing, and (vi) each of the second wall portions of the first and second connector housings defines a respective recess for receiving the third protrusion of the edge card housing.

11. The electrical connector of claim 9, wherein (i) the tail alignment housing includes a first protrusion extending from a first side thereof and a second protrusion extending from a second side thereof, (ii) the first connector housing comprises a wall portion, (iii) the second connector housing comprises a wall portion, (iv) the wall portion of the first connector housing defines a recess for receiving the first protrusion of the tail alignment housing, and (v) the wall portion of the second connector housing defines a recess for receiving the second protrusion of the tail alignment housing.

12. A connector comprising:

a first leadframe assembly comprising a first plurality of electrical contacts, wherein each of the first plurality of contacts defines a respective mating end, a respective mounting end, and a respective lead portion extending between the mating end and the mounting end;

a second leadframe assembly comprising a second plurality of electrical contacts, wherein each of the second plurality of contacts defines a respective mating end, a respective mounting end, and a respective lead portion extending between the mating end and the mounting end; and a tail-alignment housing having a housing body and a plurality of pyramidal tail supports that extend away from the housing body in a direction toward the mating ends of the electrical contacts, wherein each of the plurality of tail supports is overmolded onto a respective one of the contact mounting ends.

13. The connector of claim 12, wherein the tail alignment housing is made of plastic.

14. The connector of claim 12, wherein each mounting end includes a respective tail and the tail supports extend up the mounting ends to a point substantially near the tails.

15. The connector of claim 12, wherein the connector is an advanced mezzanine card connector.

16. The connector of claim 12, wherein the tail alignment housing includes a protrusion extending from a right side of the housing and a protrusion extending from a left side of the housing.

17. The electrical connector of claim 12, wherein (i) the first leadframe assembly further comprises a first leadframe housing overmolded onto the first plurality of electrical contacts, (ii) the second leadframe assembly further comprises a second leadframe housing overmolded onto the second plurality of electrical contacts, and (iii) the first leadframe housing is adapted to couple to the second leadframe housing.

18. The electrical connector of claim 17, wherein (i) the first leadframe housing includes a first protrusion extending therefrom, (ii) the second leadframe housing includes a second protrusion extending therefrom, (iii) the first leadframe housing defines a first recess that is adapted to receive the second protrusion, and (iv) the second leadframe housing defines a second recess that is adapted to receive the first protrusion.

19. The electrical connector of claim 17, wherein the tail alignment housing is overmolded onto the first and second leadframe housings.

20. The electrical connector of claim 12, further comprising an edge card housing, wherein (i) the edge card housing defines a plurality of receptacles, and (ii) the mating ends of the first and second pluralities of electrical contacts are received in the receptacles.

21. The electrical connector of claim 20, further comprising a first connector housing and a second connector housing, wherein each of the first and second connector housings is adapted to couple to both the edge card housing and the tail alignment housing.

22. The electrical connector of claim 21, wherein (i) the edge card housing comprises an edge card body, a first protrusion extending from a first side of the edge card body, a second protrusion extending from a second side of the edge card body, and a third protrusion extending from a third side of the edge card body, (ii) the first connector housing comprises a first wall portion and a second wall portion (iii) the second connector housing comprises a first wall portion and a second wall portion, (iv) the first wall portion of the first connector housing defines a recess for receiving the first protrusion of the edge card housing, (v) the first wall portion of the second connector housing defines a recess for receiving the second protrusion of the edge card housing, and (vi) each of the second wall portions of the first and second connector housings defines a respective recess for receiving the third protrusion of the edge card housing.

23. The electrical connector of claim 21, wherein (i) the tail alignment housing includes a first protrusion extending from a first side thereof and a second protrusion extending from a second side thereof, (ii) the first connector housing comprises a wall portion, (iii) the second connector housing comprises a wall portion, (iv) the wall portion of the first connector housing defines a recess for receiving the first protrusion of the tail alignment housing, and (v) the wall portion of the second connector housing defines a recess for receiving the second protrusion of the tail alignment housing.

24. A connector comprising:

a leadframe assembly comprising a plurality of electrical contacts, wherein each of the plurality of contacts defines a respective mating end and a respective mounting end;

a leadframe housing having a housing body that is overmolded onto the plurality of electrical contacts; and an alignment housing spaced from the leadframe housing, the alignment housing having a housing body and a plurality of supports that extend from the housing body of the alignment housing, wherein each of the plurality of supports is overmolded onto a respective one of the contacts, and each of the supports extends from the housing body of the alignment housing in a direction away from the housing body of the leadframe.

25. The connector as recited in claim 24 wherein the alignment housing is disposed closer to the mounting end than the leadframe housing.

26. The connector as recited in claim 24, wherein the supports have a round shape.

27. The connector as recited in claim 26, wherein the supports comprise cones.

28. The connector as recited in claim 24, wherein the alignment housing includes a protrusion extending from the housing.

29. The connector as recited in claim 24, wherein the housing body of the leadframe housing is spaced from the housing body of the alignment housing in a direction toward the mating end.

30. The connector as recited in claim 16, wherein the supports comprises cones.

31. The connector as recited in claim 16, wherein the alignment housing and the leadframe housing do not touch each other.

32. A connector comprising:

a first leadframe assembly comprising a first plurality of electrical contacts, wherein each of the first plurality of contacts defines a respective mating end, a respective mounting end, and a respective lead portion extending between the mating end and the mounting end, the first leadframe assembly further comprising a first leadframe housing overmolded onto the first plurality of electrical contacts;

a second leadframe assembly comprising a second plurality of electrical contacts, wherein each of the second plurality of contacts defines a respective mating end, a respective mounting end, and a respective lead portion extending between the mating end and the mounting end, the second leadframe assembly further comprising a second leadframe housing overmolded onto the second plurality of electrical contacts, wherein the first leadframe housing is adapted to couple to the second leadframe housing; and a tail-alignment housing having a housing body and a plurality of tail supports that extend from the housing body, wherein each of the plurality of tail supports is overmolded onto a respective one of the contact mounting ends, wherein (i) the first leadframe housing includes a first protrusion extending therefrom, (ii) the second leadframe housing includes a second protrusion extending therefrom, (iii) the first leadframe housing defines a first recess that is adapted to receive the second protrusion, and (iv) the second leadframe housing defines a second recess that is adapted to receive the first protrusion.

33. The connector of claim 32, wherein each tail support has a pyramidal shape.

34. The connector as recited in claim 32, wherein the tail supports have a round shape.

35. The connector as recited in claim 34, wherein the tail supports comprise cones.

* * * * *